(12) United States Patent
Jin et al.

(10) Patent No.: US 7,609,522 B2
(45) Date of Patent: Oct. 27, 2009

(54) HEAT SINK ASSEMBLY

(75) Inventors: Zhao Jin, Shenzhen (CN); Jun Cao, Shenzhen (CN); Shi-wen Zhou, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 234 days.

(21) Appl. No.: 11/566,020

(22) Filed: Dec. 1, 2006

(65) Prior Publication Data

US 2008/0130233 A1 Jun. 5, 2008

(51) Int. Cl.
*H05K 7/20* (2006.01)
*F28F 7/00* (2006.01)
*H01L 23/34* (2006.01)

(52) U.S. Cl. .................... 361/710; 361/704; 361/709; 361/719; 165/80.2; 165/80.3; 174/16.3; 257/718; 257/719; 257/722

(58) Field of Classification Search ................. 361/704, 361/709, 710, 718, 719; 165/80.2, 80.3; 257/718–719, 722; 174/16.3
See application file for complete search history.

(56) References Cited

U.S. PATENT DOCUMENTS

| 5,384,940 | A | 1/1995 | Soule et al. |
| 5,603,374 | A | 2/1997 | Wu |
| 5,757,621 | A | 5/1998 | Patel |
| 5,901,039 | A | 5/1999 | Dehaine et al. |
| 6,160,706 | A * | 12/2000 | Davis et al. .................. 361/704 |
| 6,549,410 | B1 | 4/2003 | Cohen |
| 6,667,885 | B2 * | 12/2003 | Malone et al. .............. 361/700 |
| 6,801,431 | B2 * | 10/2004 | Hartke et al. ................. 361/704 |
| 6,826,054 | B2 | 11/2004 | Liu |
| 2003/0159819 | A1 * | 8/2003 | Lee ............................ 165/185 |

FOREIGN PATENT DOCUMENTS

| CN | 1782946 A | 6/2006 |
| TW | 586652 | 5/2004 |
| TW | M267514 | 6/2005 |
| TW | M278949 | 10/2005 |

* cited by examiner

*Primary Examiner*—Jayprakash N Gandhi
*Assistant Examiner*—Zachary M Pape
(74) *Attorney, Agent, or Firm*—Frank R. Niranjan

(57) ABSTRACT

A heat sink assembly (10) compatible with an ATX motherboard (20) and a BTX motherboard (30), includes a heat sink and a plurality of fasteners (15) extending through the heat sink. The heat sink includes a base (12) defining a slot (1220) therein. The fastener is capable of sliding along the slot between a first position to a second position to make the heat sink assembly in accordance with the preferred embodiment of the present invention to be adapted for use with the ATX motherboard or the BTX motherboard.

7 Claims, 5 Drawing Sheets

HEAT SINK ASSEMBLY

BACKGROUND OF THE INVENTION

1. Field of the Invention

The present invention relates generally to a heat sink assembly, and more particularly to a heat sink assembly compatible with both ATX motherboards and BTX motherboards.

2. Description of Related Art

A computer usually has a computer chassis that may hold a motherboard, a power supply and multiple printed circuit boards (PCBs) such as graphics cards, sound cards and network cards.

There are two dominant specifications for motherboards: one is advanced technology extended (ATX) specification; the other is balanced technology extended (BTX) specification. The motherboard mounted to the computer chassis usually has electronic components such as electric capacitors, slots for random access memory (RAM), a socket for a central processing unit (CPU) mounted on the motherboard. The CPU often generates large amounts of heat during operation, which can destabilize the electronic components and cause damage to the electronic components. Typically, therefore, a heat sink is mounted on the CPU to remove heat therefrom.

However, it can not compatible with the other type motherboard once the heat sink is manufactured for mounting on either an ATX motherboard or a BTX motherboard.

What is needed, therefore, is a heat sink assembly which is compatible with both ATX motherboards and BTX motherboards and which has better heat dissipation efficiency for electronic components.

SUMMARY OF THE INVENTION

A heat sink assembly compatible with both ATX motherboards and BTX motherboards, comprises a heat sink and a plurality of fasteners extending along the heat sink. The heat sink includes a base defining a plurality of slots therein. Each of the fasteners is capable of sliding along a corresponding one of the slots between a first position and a second position to assemble a heat sink in accordance with the preferred embodiment of the present invention, thus allowing its attachment to either an ATX motherboard or a BTX motherboard.

Other advantages and novel features will become more apparent from the following detailed description of preferred embodiments when taken in conjunction with the accompanying drawings, in which:

BRIEF DESCRIPTION OF THE DRAWINGS

Many aspects of the present heat sink assembly can be better understood with reference to the following drawings. The components in the drawings are not necessarily drawn to scale, the emphasis instead being placed upon clearly illustrating the principles of the present heat sink assembly. Moreover, in the drawings, like reference numerals designate corresponding parts throughout the several views.

DETAILED DESCRIPTION OF THE INVENTION

Figure 1:
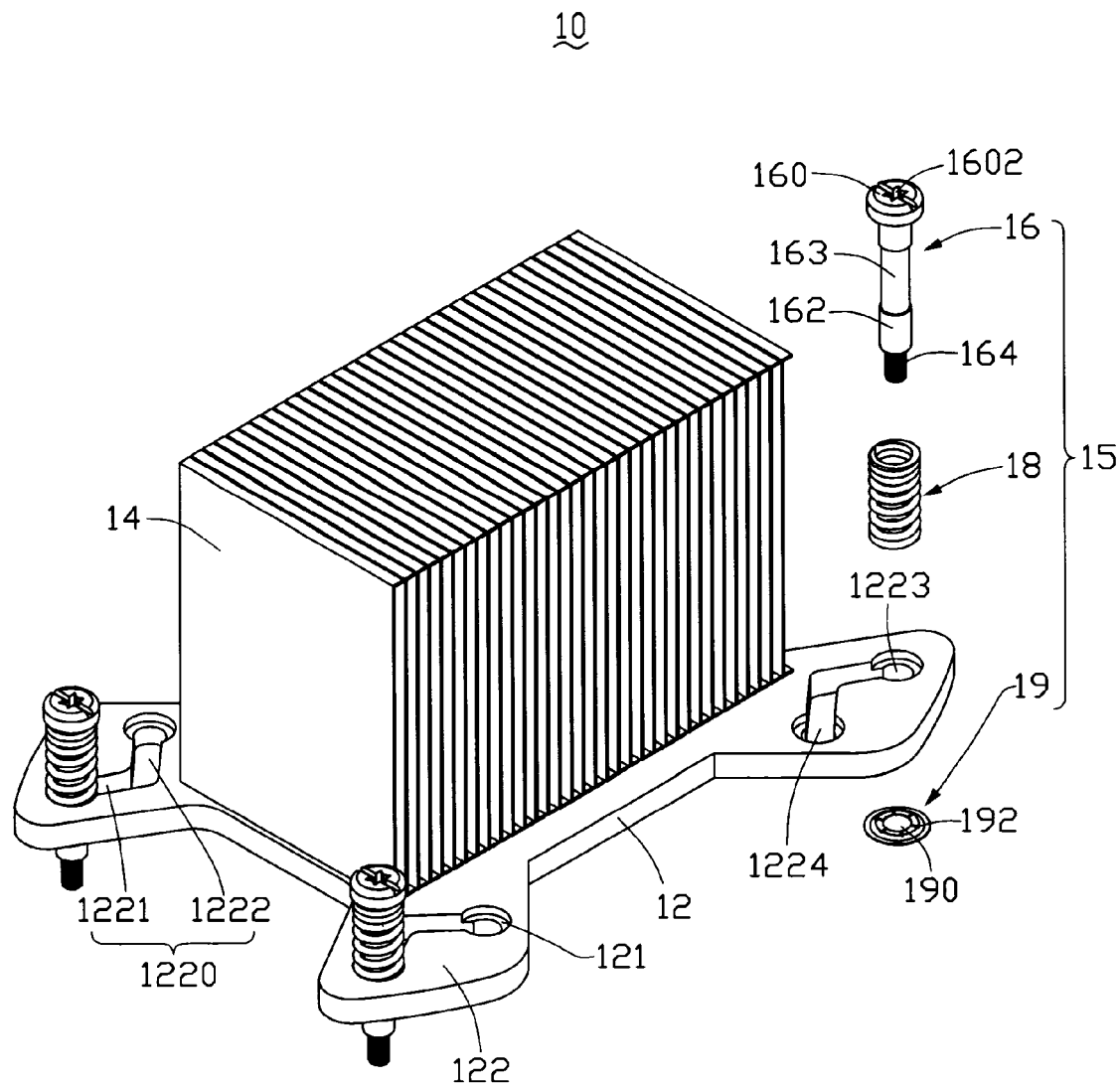
FIG. 1 is a partly exploded view of a heat sink assembly in accordance with one preferred embodiment of the present invention.
Figure 2:
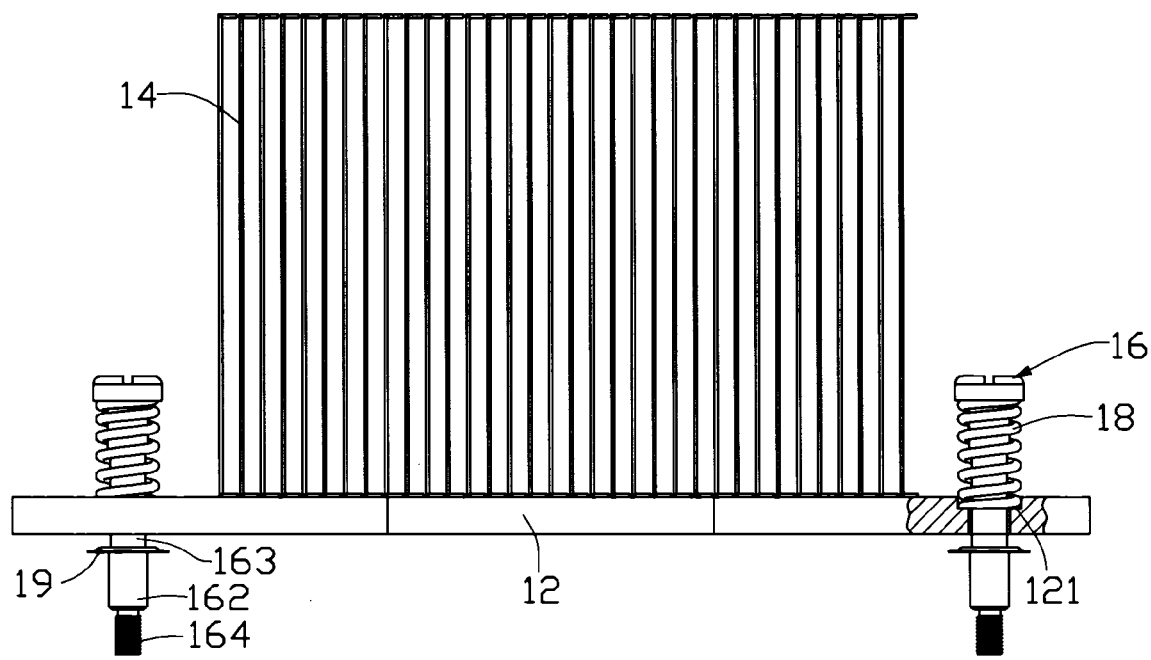
FIG. 2 is an assembled side view of FIG. 1.
Figure 3:
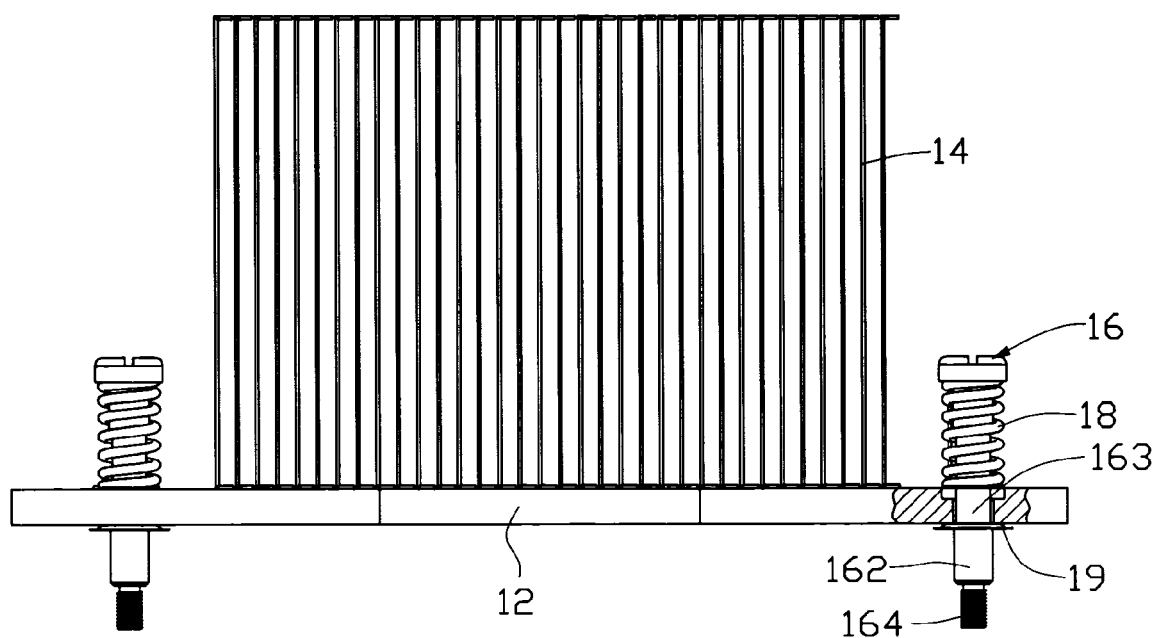
FIG. 3 is a view similar to FIG. 2, wherein a fastener of the heat sink assembly is raised a certain distance.

Referring to FIGS. 1-3, a heat sink assembly 10 in accordance with a preferred embodiment of the present invention is configured (i.e., structured and arranged) for mounting to an ATX motherboard 20 (shown in FIG. 4) or a BTX motherboard 30 (shown in FIG. 5), to dissipate heat generated by electronic components, such as a CPU (not shown) mounted on either the ATX or BTX motherboard 20, 30.

The heat sink 10 assembly comprises a base 12, a plurality of fins 14 mounted on the base 12 and four fasteners 15 extending through the base 12. The base 12 has a square body (not labeled) and four ears 122 extending outwardly and horizontally from four corners of the body. A first straight slot 1221 and a second straight slot 1222 are symmetrically defined in each ear 122. The first and second slots 1221, 1222 communicate each other and form an included angle therebetween. The first and second slots 1221, 1222 cooperatively form a V-shaped slot 1220. The first slot 1221 terminates with a circular first aperture 1223. The first apertures 1223 are located beyond front and rear sides of the fins 14. The second slot 1222 terminates with a circular second aperture 1224. The fins 14 are perpendicularly mounted on the body 120. The first and second apertures 1223, 1224 have diameters bigger than widths of the first and second slots 1221, 1222. An annular step portion 121 is formed by each ear 122 in each of the first and second apertures 1223, 1224.

The fasteners 15 corresponding to the ears 122 of the heat sink assembly 10 are used for extending through the first or second apertures 1223, 1224 to mount the heat sink assembly 10 on the ATX or BTX motherboard 20, 30. Each fastener 15 comprises a screw 16, a spring 18 and an annular pad 19 mounted around the screw 16. The screw 16 comprises a circular head 160 having two intersecting perpendicular slots 1602 for receiving a screwdriver (not shown). A diameter of the head 160 is larger than that of the first and second apertures 1223, 1224 of the base 12. The screw 16 forms an elongated shaft 162 extending from the head 160 and terminating with a threaded portion 164. An elongated annular recess (not labeled) is defined in a middle circumferential periphery of the shaft 162 such that an engaging portion 163 is formed at the recess. The engaging portion 163 has an outer diameter smaller than a width of the V-shaped slot 1220 of the ear 122 of the base 12 such that the engaging portion 163 is capable of sliding along the V-shaped slot 1220 of the base 12. The engaging portion 163 has a height along a vertical direction larger than that of the base 12 such that the engaging portion 163 is capable of moving upwardly and downwardly in the first and second apertures 1223, 1224 of the base 12 during installation. The spring 18 is dimensioned to loosely fit around the shaft 162. The spring 18 has an outer diameter smaller than that of the first and second apertures 1223, 1224 of the base 12 such that the spring 18 contacts the annular step portion 121 when installed, for exerting a spring force downwardly on the ear 122 when the fastener 15 is threadedly fastened to a retainer below the ATX or BTX motherboard 20, 30. The outer diameter of the spring 18 is larger than a width of the V-shaped slot 1220 such that a sliding of the screw 15 along the V-shaped slot 1220 is limited when the spring 18 contacts the annular step portion 121. The annular pad 19 defines a central bore 190 therein. The central bore 190 has a diameter slightly smaller than that of the shaft 162 of the screw 16 and equal to that of the engaging portion 163. A plurality of elongated slots 192 communicating with the central bore 190 are defined around the central bore 190 for providing elasticity to the annular pad 19, whereby the annular pad 19 snappingly engages with the engaging portion 163 and abuts against a lower joint of the engaging portion 163 and the shaft 162 at a bottom of the engaging portion 163 after the shaft 162 extends through the first or second apertures 1223, 1224 of the base 12 and the central bore 190 of the pad 19 to reach a position in which the engaging portion 163 extends beyond a bottom of the base 12.

In assembly, the fins 14 are fixed on the base 12 by soldering. The spring 18 is fitted around the shaft 162. The shaft 162 of each fastener 15 is then extended through one of the first and second apertures 1223, 1224 of the base 12. In this preferred embodiment, the screw 16 is extended through the first aperture 1223 of the base 12 in a manner such that the spring 18 is located between the head 160 and the step portion 121 of the base 12. The annular pad 19 snaps with a bottom of the engaging portion 163 of the screw 16 and abuts against the lower joint of the engaging portion 163 and the shaft 162 at the bottom of the engaging portion 163, thus preventing the fastener 15 from being thrown off from the heat sink assembly 10 during transportation. Thus, the heat sink assembly 10 is assembled together as shown in FIG. 2. In this position, after the heat sink assembly 10 together, the spring 18 contacts the annular step portion 121 of the base 12 and the annular pad 19 is located beyond the bottom of the base 12.

Figure 4:
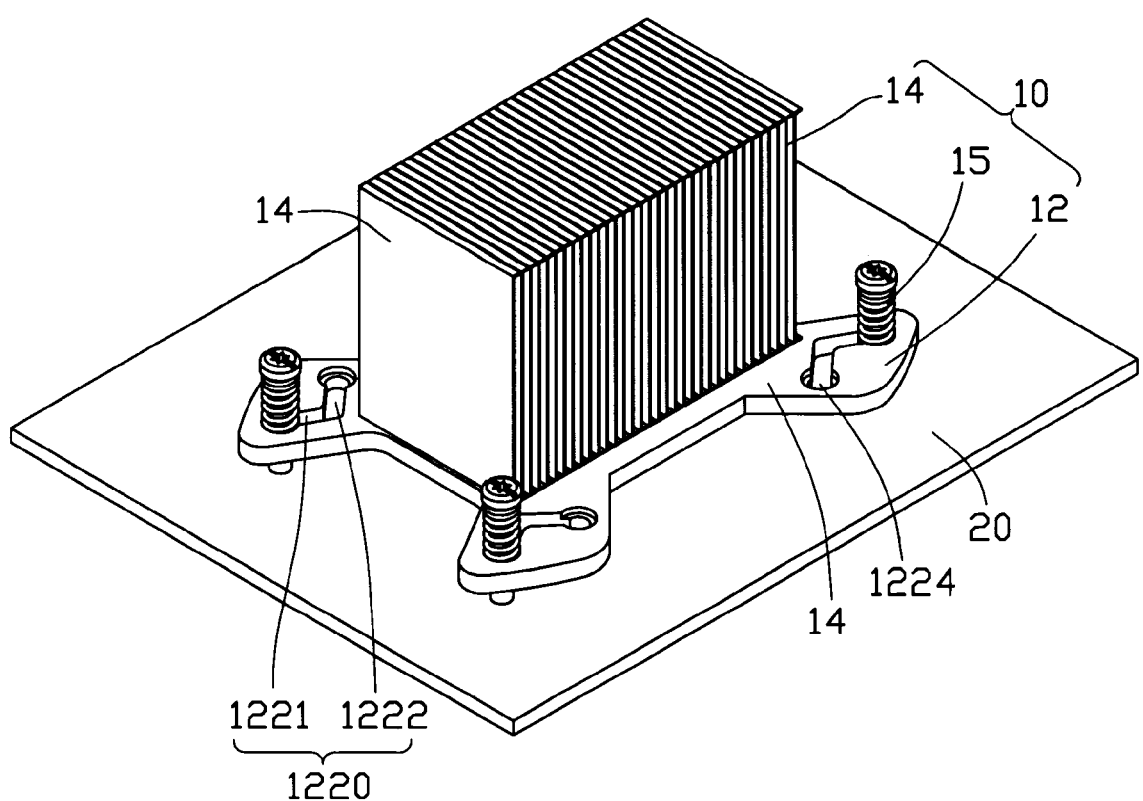
FIG. 4 is an assembled view of the heat sink assembly in a state compatible with an ATX motherboard.
Figure 5:
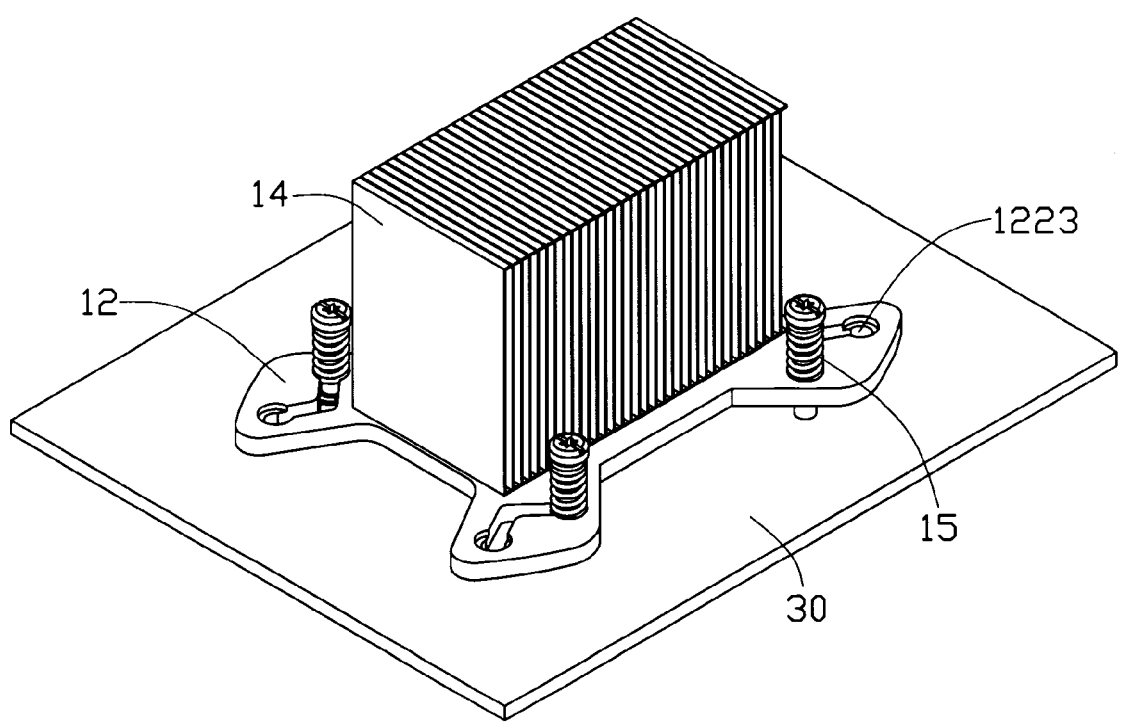
FIG. 5 is an assembled view of the heat sink assembly in a state compatible with a BTX motherboard.

Please referring to FIGS. 4-5, in use, the heat sink assembly 10 is mounted on the ATX motherboard 20 by extending the threaded portion 164 of the fastener 15 through the ATX motherboard 20 to threadedly engage with the retainer attached to the ATX motherboard 20. If the heat sink assembly 10 is to be mounted on the BTX motherboard 30, the screw 16 with the spring 18 is raised to a determined position (shown in FIG. 3), whereby a bottom end of the spring 18 is located above a top surface of the base 12 and the annular pad 19 abuts against a bottom surface of the base 12 as shown in FIG. 3. At this determined position, the fastener 15 is driven to slide along the V-shaped slot 1220 and arrive at the second aperture 1224 of the base 12. Then the screw 16 and the spring 18 is dropped, at which point the spring 18 contacts the annular step portion 121 in the second aperture 1224 of the base 12 to meet requirements of the BTX motherboards 30. The heat sink assembly 10 is mounted on the BTX motherboard 30 by extending the threaded portion 164 of the fastener 15 through the BTX motherboard 30 to threadedly engage with the retainer attached to the BTX motherboard 30. Thus, the heat sink assembly 10 is securely mounted to the BTX motherboard 30.

The heat sink assembly 10 in accordance with the preferred embodiment of the present invention is compatible with ATX and BTX motherboards 20, 30. The user can freely use it according to need.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly compatible with an advanced technology extended (ATX) motherboard and a balanced technology extended (BTX) motherboard, the heat sink assembly comprising:
    a base adapted for contacting with a heat generating device on one of the ATX and BTX motherboards, a slot defined in the base;
    a plurality of fins mounted on the base; and
    a fastener for fixing the base to the heat generating device, the fastener extending through the base and being slidable horizontally along the slot from a first position to a second position;
    wherein the fastener comprises a screw having a head and a shaft extending downwardly from the head, and a spring mounted around the shaft and located between the head of the screw and the base;
    wherein the slot has two ends, and each of the ends terminates with an aperture communicating with the slot, the aperture is used for providing passage of the fastener;
    wherein a step portion is formed in the aperture for supporting the spring thereon;
    wherein a recess is defined in the shaft of the screw thereby forming an engaging portion at the recess, and the engaging portion is slidable along the slot in the base;
    wherein the engaging portion has an outer diameter smaller than a width of the slot and a height larger than that of the base; and
    wherein an annular pad engages with the engaging portion and abuts against a joint of the engaging portion and the shaft at a bottom of the engaging portion.

2. The heat sink assembly as claimed in claim 1, wherein the heat sink assembly is mounted on the ATX motherboard when the fastener is located in the first position, and the heat sink assembly is mounted on the BTX motherboard when the fastener is located in the second position.

3. The heat sink assembly as claimed in claim 1, wherein the shaft of the screw terminates with a threaded portion.

4. The heat sink assembly as claimed in claim 1, wherein the slot has a V-shaped configuration.

5. The heat sink assembly as claimed in claim 1, wherein a plurality of ears are formed at corners of the base, and the slot is defined in one of the ears.

6. A heat sink assembly comprising:
    a heat sink defining a slot, the heat sink comprising a base and a plurality of fins extending upwardly from the base;
    a plurality of ears formed at corners of the base, the slot being defined in one of the ears; and
    a fastener comprising a head and a shaft extending from the head, the shaft having a threaded bottom end;
    wherein the shaft extends through the slot and is horizontally slidable along the slot between first and second positions for different motherboards having different specifications, respectively; and
    wherein the base defines two holes at the first and second positions, respectively, each of the holes having a diameter larger than a width of the slot, the shaft having a middle engaging portion with a diameter smaller than upper and lower end portions of the shaft, the engaging portion being received in the slot during a horizontally sliding movement of the shaft along the slot, the upper and lower end portions of the shaft each having a diameter larger than the width of the slot and smaller than that of each of the holes.

7. The heat sink assembly as claimed in claim 6, wherein a spring is mounted around the shaft of the fastener and is located between the head and the base.

* * * * *